United States Patent
Holden et al.

(10) Patent No.: US 10,496,422 B2
(45) Date of Patent: Dec. 3, 2019

(54) SERIAL DEVICE EMULATOR USING TWO MEMORY LEVELS WITH DYNAMIC AND CONFIGURABLE RESPONSE

(71) Applicant: Total Phase, Inc., Santa Clara, CA (US)

(72) Inventors: Thomas P. Holden, Sunnyvale, CA (US); Kumaran Santhanam, Sunnyvale, CA (US)

(73) Assignee: Total Phase, Inc., Santa Clara, CA (US)

( * ) Notice: Subject to any disclaimer, the term of this patent is extended or adjusted under 35 U.S.C. 154(b) by 327 days.

(21) Appl. No.: 15/349,842

(22) Filed: Nov. 11, 2016

(65) Prior Publication Data

US 2017/0139726 A1    May 18, 2017

Related U.S. Application Data

(60) Provisional application No. 62/254,331, filed on Nov. 12, 2015.

(51) Int. Cl.
*G06F 9/445* (2018.01)
*G06F 9/455* (2018.01)
(Continued)

(52) U.S. Cl.
CPC ............ *G06F 9/455* (2013.01); *G06F 9/4411* (2013.01); *G06F 12/0292* (2013.01);
(Continued)

(58) Field of Classification Search
CPC ... G06F 9/30047; G06F 13/105; G06F 9/5016
See application file for complete search history.

(56) References Cited

U.S. PATENT DOCUMENTS

| | | | | |
|---|---|---|---|---|
| 4,829,471 A | * | 5/1989 | Banerjee | G11C 7/103 340/9.1 |
| 6,470,415 B1 | * | 10/2002 | Starr | G06F 5/10 711/104 |

(Continued)

FOREIGN PATENT DOCUMENTS

| EP | 1811395 A1 | 7/2007 |
|---|---|---|
| EP | 1899832 B1 | 12/2009 |

OTHER PUBLICATIONS

Anthony Rowe, Seth Goldstein, and Gregory Kesden, "The Memory Hierarchy", Carnegie Mellon University, Introduction to Computer Systems, 10th Lecture, http://www.cs.cmu.edu/afs/cs/academic/class/15213-s14/www/lectures/10-memory-hierarchy.pdf (Year: 2014).*

(Continued)

*Primary Examiner* — Omar F Fernandez Rivas
*Assistant Examiner* — David A Hopkins
(74) *Attorney, Agent, or Firm* — Fenwick & West LLP

(57) ABSTRACT

A digital logic device is disclosed that includes registers, SRAM, DRAM, and a processor configured to store in the registers an initial portion of a first response data to a command, and store in the SRAM the first response data. The processor is further configured to store in a lookup table the memory location and size of the first response data in the SRAM, store in the DRAM additional response data, and store in the lookup table the memory location and size of the additional response data in the DRAM. The processor is configured to receive the command from a host device, retrieve the first response data from the registers or the SRAM, and send the first response data to the host. If the command includes additional response data, the processor is configured to concurrently retrieve the additional response data from DRAM and send the additional response data to the host.

20 Claims, 4 Drawing Sheets

(51) Int. Cl.
　　*G11C 14/00*　　　(2006.01)
　　*G06F 9/4401*　　(2018.01)
　　*G11C 11/00*　　　(2006.01)
　　*G06F 13/38*　　　(2006.01)
　　*G06F 12/02*　　　(2006.01)

(52) U.S. Cl.
　　CPC .......... *G06F 13/387* (2013.01); *G11C 11/005* (2013.01); *G11C 14/0009* (2013.01); *G11C 14/0054* (2013.01); *G06F 2212/1024* (2013.01); *G06F 2212/1044* (2013.01)

(56) References Cited

U.S. PATENT DOCUMENTS

| | | | |
|---|---|---|---|
| 2001/0012232 A1* | 8/2001 | Nakayama | G11C 7/1006 365/230.03 |
| 2006/0031565 A1 | 2/2006 | Iyer et al. | |
| 2008/0126716 A1 | 5/2008 | Daniels | |
| 2008/0243469 A1 | 10/2008 | Baisho | |
| 2012/0257460 A1 | 10/2012 | Norman | |
| 2014/0136738 A1 | 5/2014 | Matlock et al. | |
| 2014/0149607 A1* | 5/2014 | Shim | G06F 3/0659 710/5 |
| 2014/0310436 A1 | 10/2014 | Du | |
| 2015/0261696 A1 | 9/2015 | Christian et al. | |
| 2016/0342545 A1* | 11/2016 | Arai | G06F 12/0868 |

OTHER PUBLICATIONS

Future Technology Devices International Ltd. (FTDI Chip), "Command Processor for MPSSE and MCU Host Bus Emulation Modes" ,Application Note "AN_108", Document Reference No. FT_000109, Version 1.5, www.ftdichip.com/Documents/AppNotes/AN_108_Command_Processor_for_MPSSE_and_MCU_Host_Bus (Year: 2011).*
DSS Circuits, "Step by Step Guide on Making an I2C Slave Device with an Ardunio", Online Article, http://dsscircuits.com/articles/arduino-i2c-slave-guide (Year: 2011).*
NXP, "I2C-bus specification and user manual", UM10204, https://www.nxp.com/docs/en/user-guide/UM10204.pdf (Year: 2014).*
Arduino, "Wire Library", Online Article, https://www.arduino.cc/en/Reference/Wire (Year: 2015).*
Steve Kolokowsky, "Firmware Emulation of an I2C Slave Device", Cypress Semiconductor, Sep. 2008, http://www.cypress.com/file/73106/download (Year: 2008).*
McWilliams, John L., et al. "PPA printer controller ASIC development." Hewlett-Packard Journal 73.4 (1997): 1-12. (Year: 1997).*
PCT International Search Report and Written Opinion, PCT Application No. PCT/US2016/061669, dated Feb. 2, 2017, 12 pages.
Anonymous, "SPI Storm—Advanced information < Byte Paradigm—Speed Up Embedded System Verification," Feb. 21, 2015, 8 pages, [Online] [Retrieved on May 23, 2019] Retrieved from the Way Back Machine <URL:https://web.archive.org/web/20150221002929/https://www.byteparadigm.com/products/spi-storm/spi-storm-advanced-information/>.
Extended European Search Report, European Application No. 16865153.7, dated Jun. 14, 2019, 11 pages.

* cited by examiner

| Command | Reg. Location | SRAM Location | SRAM Size | DRAM Location | DRAM Size |
|---|---|---|---|---|---|
| 0x0A | $1 | 0x00 | Y | 0x0000 | Z |
| ... | ... | ... | ... | ... | ... |
| ... | ... | ... | ... | ... | ... |
| ... | ... | ... | ... | ... | ... |

SERIAL DEVICE EMULATOR USING TWO MEMORY LEVELS WITH DYNAMIC AND CONFIGURABLE RESPONSE

CROSS REFERENCE TO RELATED APPLICATION

This application claims the benefit of U.S. Provisional Application No. 62/254,331, filed Nov. 12, 2015, which is incorporated by reference in its entirety.

FIELD OF ART

The disclosure generally relates to the field of serial interface emulation, and specifically to a configurable serial device emulator using two memory levels.

BACKGROUND

When developing a new serial interface device, certain characteristics, such as the functionality and performance, of the serial device need to be tested in a prototype phase to ensure that they meet design requirements before migrating to a production phase. In order to test these characteristics of the prototype serial device, a serial emulator device is typically configured to respond to commands from a host device with response data in the same according to the design requirements of the serial interface device. However, existing serial emulator devices are limited and are not able to accurately reflect the expected functionality of the serial device. In particular, current serial interface devices may only respond to simple commands with fixed and short response data, due to the limitations of the emulator device in processing capability and limited storage capability. Furthermore, current serial emulator devices may not be able to respond with a fast enough response time to properly simulate the operation of higher-speed serial interfaces.

SUMMARY

To better emulate serial devices, a digital logic serial emulator device for emulating a serial interface peripheral is configured to rapidly respond to serial interface commands from a host device by accessing response data from one or a combination of static random access memory (SRAM) and dynamic random access memory (DRAM) in a specified sequence. In one implementation the entire response data to an interface command is stored in the SRAM. In another implementation, the size of response data exceeds the size of the SRAM. In such a case, a first portion of the response data is stored in the SRAM and the remaining portion of the response data associated with a particular serial interface command is stored in the DRAM. A state machine executed by the digital logic device determines which memory type is accessed to retrieve the response data, and the order or sequence of the memory accesses. The response data can be dynamically generated based on the output of a function, which may be based on any algorithm or computer instructions. Examples of a function include a function using as input a previously received command, a time based function, a function using a random variable, a response loop, a function based on a state machine, and so on. This manner in which the digital logic device responds to commands may be configured through an API.

To respond to a command from a host device when the size of the response data exceeds the size of the SRAM, the digital logic serial emulator device first retrieves the first response data from the SRAM (according to information in a lookup table), and concurrently retrieves the additional response data from the DRAM. As the access time to the SRAM is faster than the DRAM, the digital logic serial emulator device is able to send the first response data to the host device quickly. As the digital logic serial emulator device completes the sending of the first response data to the host device, it receives the additional response data from the DRAM and is able to begin sending this additional response data to the host device seamlessly without a delay.

For example, the response data is of length R, and the SRAM is of length M, which is smaller than R. The digital logic serial emulator device first retrieves the first response data portion with length M from the SRAM, and concurrently retrieves the remainder M−R from the DRAM.

In addition, an initial portion of the response data may be stored in a register of the digital logic serial emulator device in order to further improve response times. The digital logic serial emulator device uses the register when a faster access time is needed over the SRAM due to the characteristics of the serial interface protocol being emulated. If an initial portion of the first response data is stored in a register, the digital logic serial emulator device retrieves this initial portion of the first response data from the register while concurrently retrieving the response data from the SRAM. By reading from the register, which has a faster access time than the SRAM, the digital logic serial emulator device is able to further reduce the response time for sending response data to a command.

In one embodiment, a configurable digital logic device emulates a serial interface peripheral device. The digital logic device comprises a register set having register locations. The digital logic device also comprises a static random access memory (SRAM) having memory locations with a size greater than of the size of the register locations in the register set. The digital logic device additionally comprises a dynamic random-access memory (DRAM) having memory locations with a size greater than the size of the memory locations of the SRAM.

The digital logic device comprises a processor configured to store in the register locations an initial portion of a first response data to commands, wherein each of the commands is associated with one of the register locations. The processor is further configured to store in the SRAM memory locations, the first response data to the commands, wherein each of the commands is associated with one of the memory locations of the SRAM. The processor is also configured to store in a lookup table, for each of the commands, the first memory location in the SRAM storing the first response data to the command, and the size of the first response data. The processor is also configured to store in the memory locations of the DRAM, additional response data to the commands. The processor is further configured to store in the lookup table for at least one of the first plurality of commands, one of the memory locations of the DRAM storing the additional response data, and a size of the additional response data.

The processor is configured to receive a command from a host device. The processor is additionally configured to retrieve the first response data from one of the register locations and one of the memory locations of the SRAM corresponding to the command, and send the first response data to the host device.

The processor is also configured to, in response to a determination that the command includes additional response data made by retrieving from the lookup table one of the second plurality of memory locations of the DRAM storing additional response data to the command, concurrently retrieve the additional response data from the one of the second plurality of memory locations, and send the additional response data to the host device.

In one embodiment, a method is described for emulating a serial interface peripheral device on a digital logic device having a register set having register locations, an SRAM having memory locations with a size greater than the size of the register locations, and a DRAM having memory locations with a size greater than the size of the memory locations of the SRAM.

An initial portion of a first response data to a set of commands is stored in the register locations, wherein each of the commands is associated with one of the register locations.

The first response data to the commands is stored in the memory locations of the SRAM, wherein each of the commands is associated with one of the memory locations of the SRAM.

For each of the commands, the first memory location in the SRAM storing the first response data to the command, and the size of the first response data, is stored in a lookup table.

Additional response data to at least one of the commands is stored in memory locations of the DRAM.

One of the memory locations of the DRAM storing the additional response data, and a size of the additional response data, is stored in the lookup table for at least one of the commands.

A command is received from a host device. The first response data from one of the register locations and one of the memory locations of the SRAM corresponding to the command is retrieved, and the first response data is sent to the host device.

In response to a determination that the command includes additional response data, made by retrieving from the lookup table one of the memory locations of the DRAM storing additional response data to the command, the additional response data from the one of the memory locations is concurrently retrieved, and the additional response data is sent to the host device.

DETAILED DESCRIPTION

Example Serial Device Emulator with Host Device

Figure 1:
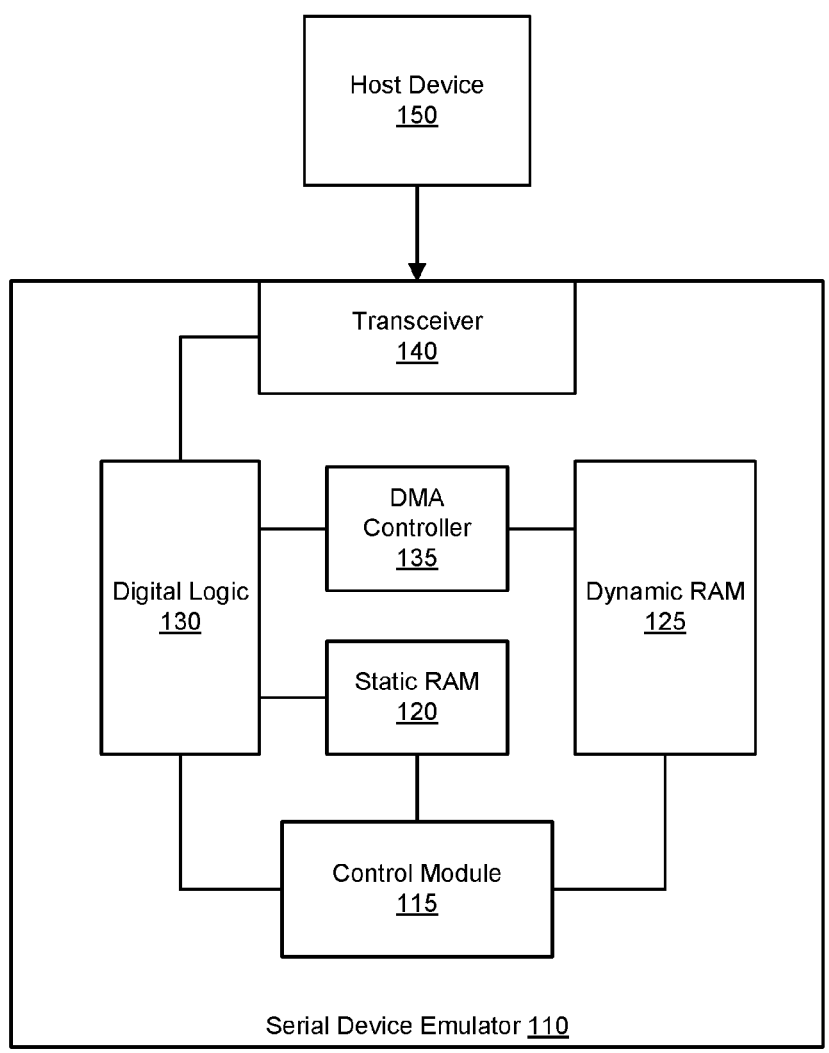
FIG. 1 illustrates an embodiment of an environment with a host device and serial device.

FIG. 1 illustrates an embodiment of an environment with a host device 150 and serial device 110. Although the illustrated environment includes the elements shown in FIG. 1, in other embodiments the environment may include different elements. Furthermore, the functionalities of each element may be distributed differently among the elements in other embodiments.

The host device 150 is a computing device that includes a serial interface. In one implementation, the host device 150 is an embedded device with the serial interface to be tested by the serial device emulator 110 to determine compatibility, function, and so on. In one implementation, the host device 150 is a computer system configured with a program development environment for developing and testing embedded software, including low-level system and operating code for peripheral devices. A program development environment preferably includes a source level debugger, a trace debug and analysis suite, optimizing compilers, a run time error checker, an integrated source code analyzer, a run time event analyzer, a performance profiler, and various hardware debug and trace probes. As configured by the program development environment, the host device 150 provides functions and capabilities beyond those of a generic computer.

The serial device emulator 110 is a device that emulates the electrical behavior of one or more serial interface devices coupled to communicate with the host device 150. As illustrated, the serial device emulator 110 includes a transceiver 140, a direct memory access (DMA) controller 135, a static random access memory (RAM) 120, a dynamic RAM 125, a digital logic 130, and a control module 115.

The transceiver 140 transmits and receives signals to and from the host device 150 via a serial interface. The serial interface may be a Serial Peripheral Interface (SPI), Inter IC Communication (I2C) bus, Controller Area Network (CAN) bus, or other serial communication interface scheme. The serial interface may employ TTL, CMOS, low-voltage differential signaling (LVDS), or other signaling methods in accordance with a particular serial interface scheme to exchange information between the transceiver 140 and the host device via the serial interface. The transceiver 140 includes a transmitter and receiver. The transmitter receives information from the digital logic 130. This information may be encoded or unencoded. In one embodiment, the interface between the transmitter and digital logic is a parallel interface, and the transmitter converts the parallel data received on the parallel interface to serial data in order to send the data to the host device 150. The receiver of the transceiver 140 performs the reverse process of the transmitter by receiving serial data from the host device 150 and sending this data to the digital logic 130, as well as converting the serial data to parallel data in the case where the interface between the digital logic 130 and the transceiver 140 is a parallel interface.

When receiving the signal from the host device 150, the transceiver 140 converts the received signal from the original protocol on the serial interface to a supported or common format used by the digital logic 130. In one embodiment, the transceiver 140 converts the signals by using a mapping table stored on the serial device emulator 110 that maps commands from the original protocol to commands to a supported format of the digital logic. Each of the serial interface protocols may support commands that share common functions with each other. For example, each protocol may support a read command. In one embodiment, all commands with common functionality are translated by the transceiver 140 to a single command supported by the digital logic 130. Thus, although each serial interface protocol may encode a command of a particular function differently from each other, as these commands have the same functionality, the transceiver 140 converts these commands to a same uniform command. For example, the transceiver 140 may translate all commands related to reading data to a standard read command that can be understood by the digital logic 130. The uniform command may be borrowed from an existing standard or may be proprietary. In another embodiment, the transceiver 140 sends the commands directly to the digital logic 130 without conversion.

As the interface is serial, each command is received serially one bit at a time. In one embodiment, the transceiver 140 waits to receive all bits of a command before translating it or sending it to the digital logic 130. In the case where the interface between the digital logic 130 and the transceiver 140 is parallel with a specific bus width (e.g., 8 bits), the transceiver 140 places into a buffer each bit of data based on the size of the bus width. Each bit may be placed in the buffer in accordance to the clock rate of the incoming serial data stream. The clock rate may be recovered using a clock data recovery circuit included in the receiver. The size of this buffer may be a multiple of the bus width (e.g., 8 bits, 16 bits). In another embodiment, the transceiver 140 sends bits of a partially received command to the digital logic 130 before having received the entire command. Instead of waiting for the entire command to be received through the serial interface, the transceiver 140 sends a subset of the bits of the command to the digital logic 130 before the entire set of bits of the command have been received.

The DMA controller 135 provides an interface for the digital logic 130 to directly access the DRAM 125. The DMA controller 135 receives a request from the digital logic 130 to read data at a certain address from the DRAM 125. In response, the DMA controller 135 accesses the DRAM 125 at the desired address and reads data of the desired size. On occasion, depending on the size of the response data, the DMA controller 135 will read the data in the DRAM 125 from multiple separate physical regions in the DRAM 125. In one embodiment, the DMA controller 135 reads the data from the DRAM 125 in parallel. Note that when the DMA controller 135 accesses the DRAM 125, it frees up the control module from having to process the memory access. This results in overall faster access rates to the DRAM 125 as the DMA controller 135 can process a large data access to the DRAM 125 without delay compared to the control module.

The SRAM 120 is a memory that stores response data to the commands from the host device. The SRAM 120 has a relatively fast access time compared to other types of memory, such as the DRAM 125. For example, the time between a request to read one bit and the response from the SRAM 120 of that bit value may be 2-12 nanoseconds (ns), which may correspond to a few clock cycles depending on the frequency of the clock. By comparison, the access time of DRAM may be of a magnitude slower at 10-60 ns, and a comparable increase in clock cycles. To achieve faster access times, SRAM implementations require additional transistors and are relatively expensive compared to other types of memory, and is typically implemented in lesser relative capacities. For example, the SRAM 120 may be 256 bytes.

As noted above, the SRAM 120 stores the response data to commands from the host device. In particular, the SRAM 120 stores a first response data portion of a full response data to a command. The full response data is the complete response to a command. This first response data has a size that is equal to or smaller than the size of the SRAM 120. The DRAM 125 is a volatile memory that stores additional response data to the commands from the host device. As noted above, the DRAM 125 has access times that are a few times higher than the SRAM 120. However, the DRAM 125 is less expensive to produce and can thus be included in greater quantities. For example, the DRAM 125 may be 768 bytes in size.

In some cases the entire response data is stored in SRAM 120. While, in other cases a portion of the entire response data is stored in SRAM 120 as a first response data and the remaining portion of the response data is stored in DRAM 125 as additional response data. In other words, if the full response data has a size R, and the SRAM 125 has a size M, the first response data is of length M, and the additional response data is of length R-M.

The digital logic 130 responds to commands from the transceiver 140 with the response data retrieved from memory on the serial device emulator 110. When the digital logic 130 receives a command from the transceiver 140, using a lookup table, the digital logic 130 retrieves the associated response data from the SRAM 120 and concurrently from the DRAM 125 via the DMA controller 135 if needed based on the size of the response data. The digital logic 130 then sends this response data back to the transceiver 140 to be sent back to the host device 150. By retrieving data from the SRAM 120, the digital logic 130 achieves a fast response time that mimics the response time of an actual serial device, even though the response is emulated. By also using the DRAM 125, the digital logic 130 is able to accommodate a response data size larger than the SRAM 120.

More specifically, in response to receiving a command from the transceiver 140, the digital logic 130 retrieves the response data for the command from the SRAM 120. The digital logic 130 may use the command to index into a lookup table and retrieve from there the memory location and size of the response data in the SRAM 120. The digital logic then reads the response data at the given memory location from the SRAM 120.

Concurrently, the digital logic 130 determines whether the full size of the response data (as indicated from the lookup table) exceeds the fixed size of the memory in the SRAM 120, which would indicate that additional response data to the command is stored in DRAM 125. In one embodiment, the digital logic 130 makes this determination using the lookup table. If the DRAM 125 includes additional response data to the command, the digital logic 130 concurrently retrieves this additional response data from the DRAM 125 based upon a memory location and size for the additional response data stored in the lookup table.

The digital logic 130 sends the response data in the SRAM 120 (i.e., the "first response data") to the transceiver 140. The digital logic 130 may also send the additional response data from the DRAM 125 to the transceiver 140. The additional response data may be first loaded from the DRAM 125 into the SRAM 120, and then sent by the digital logic 130 to the transceiver 140. The additional response data may be loaded while the first response data is being sent. The digital logic 130 may send the response data in sections to the transceiver 140 concurrently as it reads the data, upon each synchronization signal or clock cycle, or upon completing the entire read operation.

In one embodiment, the digital logic 130 partially receives a command from the transceiver 140. In response to receiving this partial command, the digital logic 130 uses the lookup table to retrieve a partial indication of the memory location and/or size for the response data (which may be in the SRAM 120 or DRAM 125). This allows for the digital logic 130 to commence partial memory location selection in the respective SRAM 120 or DRAM 125 prior to the receipt (i.e., decode) of the entire command.

For example, a full command may comprise 8 bits. Once the digital logic 130 receives a partial portion of this full command, the digital logic 130 uses the lookup table with this partially received command to retrieve a partial indication of a memory location. In this case, the lookup table includes a partial indication of a memory location for the partially received command, and a complete memory location for a corresponding full command. The partial indication of the memory location may be a coarse location of the response data in the respective memory (e.g., the partial indication of the memory location may indicate the most significant number of bits of the memory location of the SRAM 120, which may correspond to a row, column, or other subset of the entire range of memory locations of the SRAM 120).

By retrieving the additional response data concurrently from the SRAM 120 and DRAM 125, the digital logic 130 can quickly send the first response data in the SRAM 120 to the transceiver 140 due to the high speed and low latency of the SRAM 120, and subsequently send the additional response data from the slower DRAM 125 without interruption, as the digital logic 130 can begin to retrieve the data from the DRAM 125 before it completes the sending of data from the SRAM 120. This concurrent retrieval allows the digital logic 130 to compensate for the slow response time of the DRAM 125. This allows the serial device emulator 110 to accurately emulate a delivered response while also reducing the use of SRAM 120.

The control module 115 sets the initial configuration of the serial device emulator 110, and the contents of the SRAM 120 and the DRAM 125. The use of the initial configuration information is further described below.

The control module 115 sets the contents of the SRAM 120 and the DRAM 125. The contents of the SRAM 120 and the DRAM 125 depend upon the response data that is specific for a command, as determined by the defined behavior for the serial device that is being emulated. In one embodiment, if the response data is larger than the SRAM 120, the control module 115 automatically partitions the data into a first response data portion to store into the SRAM 120 that fits the size of the SRAM 120 and into an additional response data portion to store in the DRAM 125. For example, the SRAM 120 may be 256 bytes in size. In such a case, if a response data is comprised of one or more messages, each message 512 bytes, the first 256 bytes of the 512 byte response data may be stored in the SRAM 120 as a first response data partition, with the remaining 256 bytes of the response data being stored in the DRAM 125 as an additional response data partition. In other examples, the size of the SRAM may be greater or less than 256 bytes, and/or the size of each message may be greater than or less than 512 bytes. The first response data is an initial section of the response data and the additional response data is the remainder. The control module 115 also configures the digital logic 130 on how to send the response data by configuring the lookup table of the digital logic 130 on the memory locations and sizes of the first and additional response data in the SRAM 120 and DRAM 125.

The configuration that the control module 115 may set for the serial device emulator 110 may include the serial interface protocol to be supported, as well as a configuration for the digital logic 130. In one embodiment, the control module 115 configures the digital logic 130 to store a function, such as an algorithm, so that the digital logic 130 will respond dynamically to a command based on the function. In other words, the response to a command changes based on the output of the function. Alternatively, the output of the function is used to set as new response data to a command in the SRAM 120. The function may be based on a prior command and/or response, the current time, or other operation or factors. In another embodiment, the function may be designed so that the new response data represents edge cases or bugs. This allows the behavior of the serial device to be dynamically configured during operation, which enables emulation of very complex, real time behavior.

As an example, the control module 115 may configure the digital logic 130 to execute a function that modifies a response data to a read command based on data indicated in a write command. The ability to modify the response data based on the output of a function allows the serial device emulator 110 to emulate a serial device with dynamic responses that change based on a variety of factors, including a prior response and/or command. Such an emulator is able to fully emulate the response pattern of an actual serial interface device, and allows a developer of a serial interface device to further prototype using the emulator instead of with more expensive prototyping solutions such as using custom fabricated circuit boards.

Example Digital Logic

Figure 2:
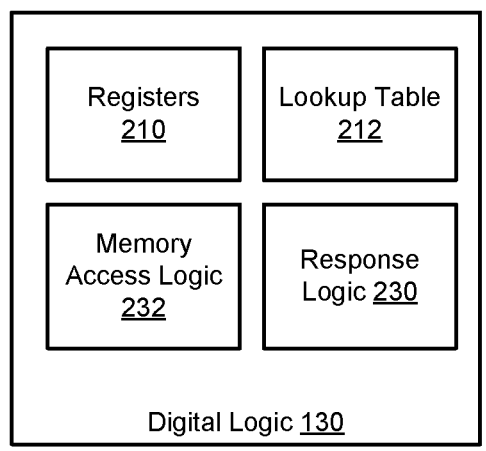
FIG. 2 illustrates the digital logic of FIG. 1 according to an embodiment.

FIG. 2 illustrates the digital logic 130 of FIG. 1 according to an embodiment. As illustrated, the digital logic 130 includes registers 210, a lookup table 212, a memory access logic 232, and a response logic 230. Although the illustrated digital logic 130 includes the elements shown in FIG. 2, in other embodiments the digital logic 130 may include different elements. Furthermore, the functionalities of each element may be distributed differently among the elements in other embodiments.

Each of the registers 210 stores an initial portion of the response data to a command, such as up to the first N bytes, where N is less than the size of the SRAM. The registers 210 are made of custom transistor logic and can store a small amount of data (e.g., 8 bits). Compared to other types of storage, the registers 210 typically have the fastest access times. For example, the registers may have access times of 1-3 ns (or less), which may correspond to a single clock cycle. The registers 210 have a faster response time than the SRAM 120, and so retrieval of data from the registers 210 can occur faster than retrieval of data from either the SRAM 120 or the DRAM 125.

The lookup table 212 stores the memory locations and sizes in the SRAM 120 and DRAM 125 for first response data and additional response data, respectively. The information in the lookup table 212 may be retrieved to determine at what position in the SRAM 120 or DRAM 125 to read from and for how many blocks to read from in order to retrieve the correct response data to a command. In one embodiment, this information is stored in the lookup table 212 as a mapping between commands and these memory locations and sizes. In order to enable efficient lookup (e.g., in constant time), the lookup table may be indexed using the binary value of the command such that the value of the command can be directly used to reference the correct entry in the data array representing the lookup table. In another embodiment, the lookup table 212 also stores a mapping of commands to registers 210 indicating which registers store the initial portion of a first response data for a command. Each command may also include one or more operands, in which case the lookup table 212 stores a mapping of a response data to a command with a particular set of operands.

The memory access logic 232 enables the digital logic 130 to access the SRAM 120 and the DRAM 125 concurrently. Unlike memory interfaces that access different memory locations serially, the memory access logic 232 is configured to have at least two memory buses, with one coupled to the SRAM 120 and the other coupled to the DRAM 125 (via the DMA 135). Since the DRAM 125 has a slower response time than the SRAM 120, any access request made by the memory access logic 232 to the SRAM 120 will have a faster access time than an access request made to the DRAM 125. However, by being able to concurrently access both the SRAM 120 and the DRAM 125, the memory access logic 232 is able to begin receiving data from the DRAM 125 before it finishes receiving data from the SRAM 120 in response to an access request for data split across both the SRAM 120 and the DRAM 125. In some cases, the first response data stored in the SRAM 120 (or additional response data stored in the DRAM 125) is larger than the memory bus width of the SRAM 120 (or DRAM 125). For example, the first response data may be of size 256 bytes, while the memory bus width is 8 bits in width. In such a case, the memory access logic 232 retrieves the first response data (or additional response data) over multiple clock cycles. For example, the memory access logic 232 may retrieve an 8 bit chunk of the first response data upon each rising clock edge of the clock cycle, and complete the retrieval of the first response data after 256 cycles.

If a response data to a command is split across the SRAM 120 and the DRAM 125 such that the first part of the response data is stored in the SRAM 120 and an additional part of the response data is stored in the DRAM 125, then the memory access logic 232 is able to retrieve the full response data with the access time delay minimized to an initial delay equal to the access time for the SRAM 120. Note that as referred to here, the access time of a volatile memory is the time for the volatile memory to return the first bit of data (e.g., in a DRAM without any row already selected, this may be equal to the column address strobe (CAS) latency plus the row address to CAS delay (tRCD)).

Data can also be written to the SRAM 120 and or DRAM 125 in response to a command. In such a case, the memory access logic 232 writes the data to the indicated location in the SRAM 120 or DRAM 125.

The response logic 230 determines and retrieves an appropriate response to a command. The response logic 230 provides a response in a timeframe consistent with the required response time dictated by the serial interface protocol that is being emulated. In order to do this, the response logic 230 retrieves a smaller initial portion of the first response data from the registers 210, while concurrently retrieving the first response data from the SRAM 120. In some embodiments, the first response data stored in the SRAM 120 does not include the smaller initial portion of the first response data stored in the registers 210. Some serial interface protocols may be clocked at such a high speed such that the response time to retrieve response data from the SRAM 120 is not fast enough to respond at the correct clock cycle. In this case, the response logic 230 retrieves an initial portion of the first response data from the registers 210 (e.g., this portion is equal to the register width) while concurrently retrieving the first response data from the SRAM 120 via the memory access logic 232 in order to improve the initial response time.

As an example, the serial interface protocol may require that an initial portion of the response data be sent to the host device 150 at the next synchronization signal or clock cycle following a clock cycle where the last portion of the command was received. To respond to the command, the response logic 230 may first retrieve the first response data from the registers 210 while simultaneously retrieving data from the SRAM 120 via the memory access logic 232. As the registers 210 have a faster access time than the SRAM 120 (e.g., within one clock cycle), the response logic 230 is able to send the initial portion of the first response data back to the host device 150 using the initial portion of the first response data stored in the registers 210.

To determine which register 210 includes the initial portion of the first response data to the command, the response logic 230 may use the lookup table 212. In other embodiments, each register 210 may be mapped one-to-one to a command based on a bit mask or other function applied to the value of the command, and the response logic 230 applies this function to the command to determine the correct register 210 from which to retrieve data.

In one embodiment, the response data is of a fixed size and the bit (i.e., binary) value of the command is mapped directly to an address in the SRAM 120. In this case, the response logic 230 uses the binary value of the command to directly retrieve the response data from the SRAM 120 via the memory access logic 232. If the SRAM 120 is 256 bytes, the response logic 230 can use a memory address of 8 bits to address the SRAM 120. Each command may also be 8 bits in length, and so each item of response data is arranged in the SRAM 120 as to be located at an address corresponding to the value of the command. The response logic 230 can use the 8-bit command as the address and the 8-bit length as the size for the memory access logic 230 to retrieve the 8-bit response data from the SRAM 120.

In one embodiment, the memory location in the SRAM 120 for the response data to a command is stored in the lookup table 212. Additionally, the size of each response data is stored in the lookup table 212. After receiving a command, the response logic 230 looks up the corresponding memory location and address of the response data using the lookup table 212 and retrieves the response data from the corresponding location in the memory.

Concurrent to retrieving data from the SRAM 120, the response logic 230 also determines whether the size (number of bytes) of full response data to the command is larger than the size capacity of the SRAM 120. If so, the response logic 230 retrieves the additional response data to the command from the DRAM 125. In one embodiment, the response logic 230 determines whether the full response data is larger than the size capacity of the SRAM 120 by determining whether the lookup table includes an entry for the command that includes a memory location and size in the DRAM 125. In another embodiment, the response logic 230 determines this by using the lookup table 212 to determine if a flag is set indicating that a command includes additional response data in the DRAM 125.

Once the response logic 230 determines that additional response data is present in the DRAM 125, the response logic 230 concurrently retrieves the additional response data from the DRAM 125 by looking up the memory location and size of the additional response data in the lookup table 212 and retrieving the data at that memory location for that size. By concurrently retrieving the additional response data from the DRAM 125, the response logic 230 is able to send the additional response data retrieved from the DRAM 125 to the host device 150 (via the transceiver 140) as it completes the sending of the first response data in the SRAM 120. This ensures a fast response time and an uninterrupted response data stream to the host device 150 while reducing the amount of more expensive SRAM 120 needed.

In one embodiment, the response data changes based on the output of a function, such as an algorithm, program, or other deterministic method. The function may at least be based on the time, an iterative (looped) method, a database lookup, incoming commands, past commands or responses, external inputs, or a random number generator. In one embodiment, the function may be based on a combination of different methods. Additionally, the function may be configured to generate output that emulates an edge case for a serial device. The response logic 230 is configured with the function and executes the function to determine an output of the function and modification of the existing response data for a command in the registers, SRAM 120, and/or DRAM 125 with the new response data that is based on the output of the function. In one embodiment, the response logic 230 also uses a different function for each response data to each command.

As an example, the function may emulate a global positioning system (GPS) device and output a value conforming to longitude and latitude coordinates that change based on the time. Furthermore, the function may be configured to periodically output a lost signal edge case. The response logic 230 may use this output to change the response data to a command in the SRAM 120 and DRAM 125. When an incoming command arrives from the host device 150 requesting the GPS coordinates, the response logic 230 may then retrieve the corresponding response data and send it to the host device 150. The response logic 230 may subsequently modify the response data again based on the output of the function such that the response data to a subsequent command requesting GPS coordinates may be different (e.g., a different set of GPS coordinates may be returned by the response logic 230).

In one embodiment, the response logic 230 receives a command to write data. Upon receiving such a command, the response logic 230 writes the specified data to a portion of the SRAM 120 and/or DRAM 125 and also stores in the lookup table 212 an entry with a mapping between a read command for this data and the memory location and size of the specified data that was written. The response logic 230 may also write an initial portion of the specified data to a register 210 as well. When a read command for this data is received, the response logic 230 processes it according to the methods described above.

In one embodiment, the response logic 230 receives a command that indicates that a pre-determined set of commands stored in memory should be decoded (i.e., interpreted). Upon receiving this command, the response logic 230 retrieves the predetermined set of commands from the predetermined location in the SRAM 120 or DRAM 125 via the memory access logic 232 and interprets the commands. Subsequently, the response logic 230 may wait for a period of time (e.g., a predetermined number of clock cycles) before retrieving any response data for these commands.

Example Control Module

Figure 3:
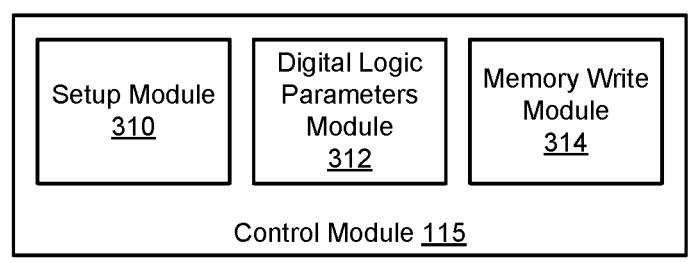
FIG. 3 illustrates the control module of FIG. 1 according to an embodiment.

FIG. 3 illustrates the control module 115 of FIG. 1 according to an embodiment. As illustrated, the control module 115 includes a setup module 310, a digital logic parameters module 312, and a memory write module 314. Although the illustrated control module 115 includes the elements shown in FIG. 3, in other embodiments the control module 115 may include different elements. Furthermore, the functionalities of each element may be distributed differently among the elements in other embodiments. In one embodiment, the control module 115 is represented in instructions stored in a non-transitory computer readable storage medium and executed by a processor.

The setup module 310 sets up the initial configuration for the serial device emulator 110. The setup module 310 may receive from a user various configuration options and uses these to configure the serial device emulator 110. Configuration options may include the serial interface protocol to use, the clock speed, the voltage of the interface, and other serial interface parameters. Configuration options may also include a maximum size of the SRAM 120 to allocate to each first response data.

The digital logic parameters module 312 configures the parameters for the digital logic module 130. Parameters may include a maximum size for writing a first response data to the SRAM 120, a delay time to respond to a command, a timeout period to wait for a response from the memory, an error handling configuration, and other parameters. In one embodiment, the parameters for the digital logic module 130 include the functions associated with one or more commands that the digital logic module 130 uses to change the response data based on the output of the functions as described above.

In one embodiment, the digital logic parameters module 312 selects these functions from a library of functions according to a user configuration. The library of functions may be provided by the vendor of the serial device emulator 110 or may be provided by other developers. Functions may be created by developers using an application programming interface (API) and/or software development kit (SDK) provided by the vendor of the serial device emulator 110. This provides an easy way for developers to emulate a serial device. For example, the library of functions may include functions that emulate responses for a variety of devices, such as a GPS device or weather sensor, and the user configuration may instruct the digital logic parameters module 312 to select the particular functions from the library for which emulation is required. The digital logic parameters module 312 then configures the digital logic module 130 with these functions such that the serial device emulator 110 can emulate the desired serial device.

The memory write module 314 writes the initial response data to the SRAM 120, the DRAM 125, and the registers 210. During initial configuration, a user may wish to write certain response data to commands. The memory write module 314 writes the response data to the SRAM 120, the DRAM 125, and the registers 210 and enters the corresponding mappings to the lookup table 212. This process may be done offline before the serial device emulator 110 is initiated for operation.

Example Response Data Distribution

Figures 4A, 4B:
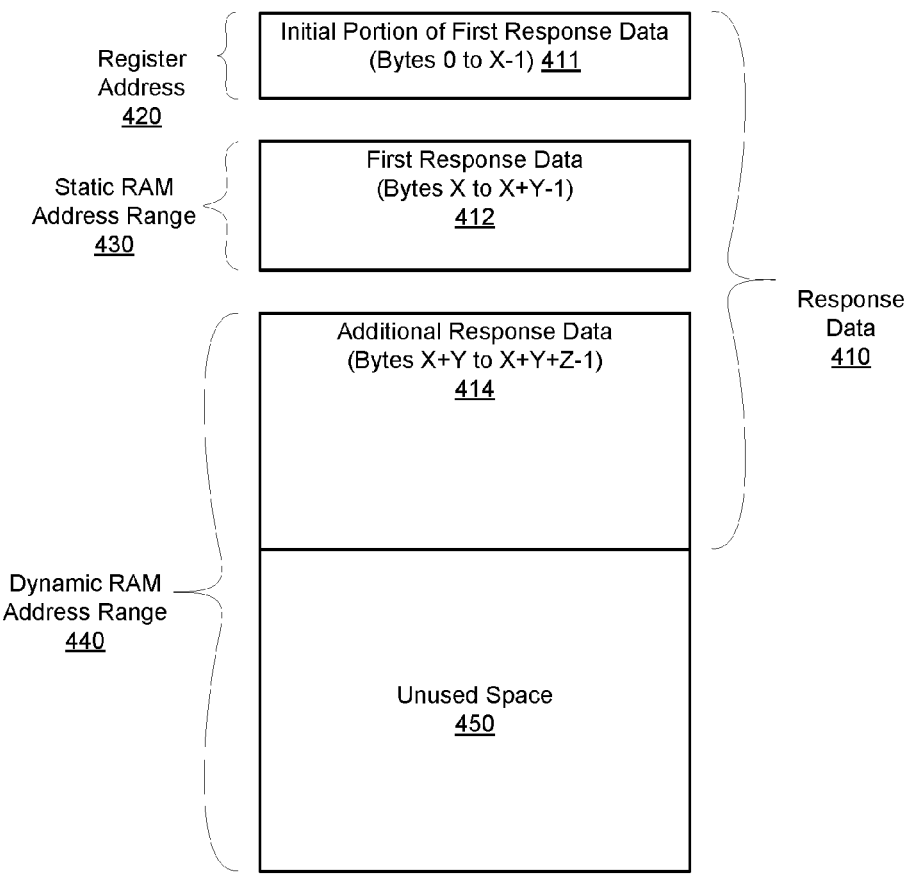
FIG. 4A illustrates an example of a distribution of a response data across the registers, SRAM and the DRAM.
FIG. 4B illustrates an example of the lookup table indicating the memory locations and sizes of response data for the response data illustrated in FIG. 4A

FIG. 4A illustrates an example of a distribution of a response data 410 across the registers 210, SRAM 120 and the DRAM 125. As illustrated, the response data 410 spans a total of X+Y+Z bytes. Assuming that the SRAM 120 can only store a maximum response data of Y bytes, then, as illustrated, a first response data 412 stored in the SRAM address range 430 for the response data 410 includes bytes X to X+Y−1. The additional response data 414 is stored in the DRAM address range 440 and includes bytes X+Y to X+Y+Z−1. As the DRAM may be larger than the size of the additional response data 414, the DRAM address range 440 may also include additional unused space 450. In one embodiment, the response data is stored in the SRAM 120 and DRAM 125 as illustrated by the memory write module 314.

In one embodiment, in addition to storing the response data in the SRAM 120 and the DRAM 125, the serial emulator device 110 also stores a smaller initial portion 411 of the first response data in a register address 420 of size X, containing bytes 0 to X−1 of the response data. The size of this initial portion 411 is fixed to the size of the register. In the illustrated example, the register is 32 bits, and so the initial portion 411 of the first response data is 4 bytes long. However, where the register size differs, the initial portion 411 also changes. Note that if the serial device emulator 110 does not include a register, then the response data is first stored in SRAM (e.g., bytes 0 to Y−1) with the remainder in DRAM (e.g., bytes Y to Y+Z−1).

FIG. 4B illustrates an example 460 of the lookup table 212 indicating the memory locations and sizes of response data for the response data 410 illustrated in FIG. 4A. As illustrated, the exemplary lookup table 460 maps a command with a register location, an SRAM location and size, and a DRAM location and size. In the exemplary lookup table 460, the 8-bit command is represented using a two-digit hexadecimal value. The SRAM location indicates the byte-addressable memory location of the first response data to the command. The SRAM size indicates in bytes the size of the first response data. The DRAM location indicates the byte-addressable memory location of the additional response data. The DRAM size indicates in bytes the size of the additional response data.

In the exemplary lookup table 460, the response to the command "0x0A" is the response data 410 illustrated in FIG. 4A. As illustrated, the initial portion 411 of the first response data is stored in register "$1." The first response data 412 is stored at SRAM memory location "0x00" and is of size Y. This corresponds to the bytes X to X+Y−1 of the first response data 412 as illustrated in FIG. 4A. The additional response data is stored at a DRAM memory location "0x0000" and is of size Z.

In some cases, the size of the response data to a command is smaller than the total size of the SRAM 120. For example, the SRAM may be 256 bytes in size and the size of a response data may only be 8 bytes, and would thus be less than the size of the SRAM. In such a case, the serial emulator device 110 stores first response data for additional commands in the SRAM 120 as well. If the response data exceeds the remaining size of the SRAM 120, any additional response data is stored in the DRAM 125.

In one embodiment, in order to support fast response times for multiple commands, the first response data to each command is limited to a size smaller than the size of the SRAM 120. This size is set by the serial device emulator 110 based on the response time required for the serial interface being emulated. The size is set so that by the time the serial device emulator 110 has sent the entirety of the first response data to the host device 150, it has read a sufficient amount of the additional response data from the DRAM 125 to send the additional response data from the DRAM 125 to the host device 150 without interruption.

In one embodiment, the lookup table 212 is separated into separate sub-tables mapping commands to register locations, commands to SRAM locations and sizes, and commands to DRAM locations and sizes. This allows the lookup table 212 to save storage space, as not each command may have a DRAM location and size.

Example Flows

Figure 5:
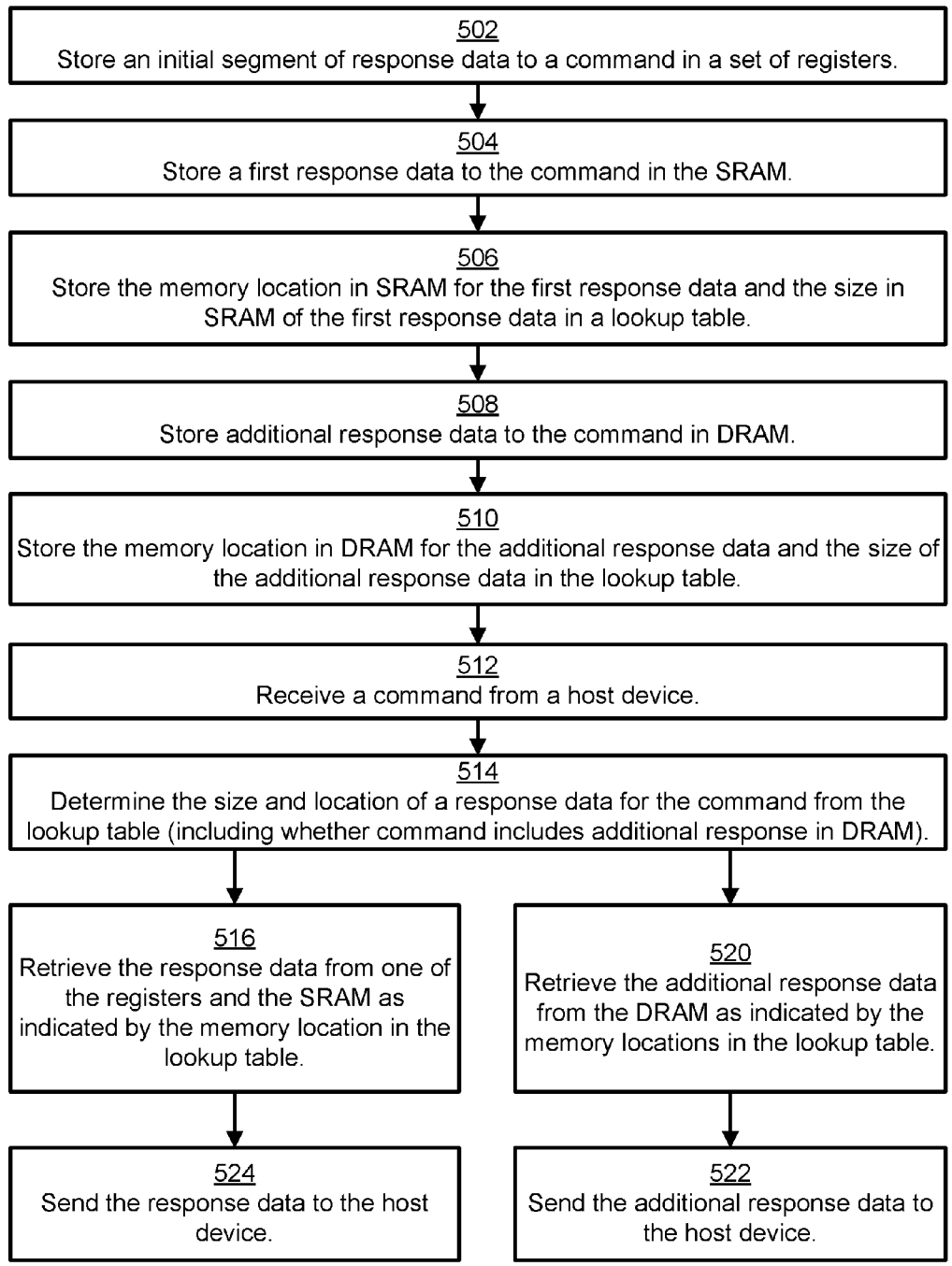
FIG. 5 is a process illustrating the retrieval of response data to a command according to an embodiment.

FIG. 5 is a process illustrating the retrieval of response data to a command according to an embodiment. In one embodiment, the process of FIG. 5 is attributed to the serial device emulator 110.

The serial device emulator 110 stores one or more items of response data to one or more commands. Thus, initially, the serial device emulator 110 stores 502 an initial segment of response data to a command in a set of registers, such as registers 210.

The serial device emulator 110 also stores 504 a first response data in the SRAM 120. The first response data has a size that is equal to or smaller than the size capacity of the SRAM 120.

The serial device emulator 110 additionally stores 506 the memory location in SRAM for the first response data and the size in SRAM of the first response data in a lookup table. In one embodiment, this is lookup table 212.

The serial device emulator 110 may store 508 additional response data to the command in DRAM 125 if for that command the response data exceeds the size capacity of the SRAM 120. The serial device also stores 510 the memory location in DRAM for the additional response data and the size of the additional response data in the lookup table.

The serial device emulator 110 receives 512 a command from a host device, such as host device 150.

The serial device emulator 110 determines 514 the size and location of a response data for the command from the lookup table. The serial device emulator 110 also determines 514 whether additional response data is included for the command and is stored in DRAM.

The serial device emulator 110 retrieves 516 the response data from the registers and SRAM as indicated by the memory location in the lookup table. The serial device emulator 524 sends the response data from the registers and SRAM to the host device.

If the serial device emulator 110 determines that the command does include additional response data, the serial device emulator 110 retrieves 520 the additional response data from the DRAM 125 as indicated by the memory locations in the lookup table. The serial device emulator 110 sends 522 the additional response data to the host device 150.

In one embodiment, the retrieval and sending of the response data from the registers, SRAM, and DRAM (516/524 and 520/522) are performed concurrently (e.g., in parallel). By concurrently retrieving the data from the registers, SRAM, and DRAM, the serial device emulator 110 is able to emulate a fast response time (similar to a serial device) but with the use of less expensive memory components.

For example, in a particular response, the serial device emulator 110 retrieves the response data in parallel from the registers, SRAM, and DRAM. The retrieval of data from the registers is the fastest (e.g., a few nanoseconds), and this data can be sent to the host device 150 with the lowest latency as well. While data is being retrieved and sent from the registers, the serial device emulator 110 is also accessing the SRAM. While the access time to the SRAM is slower, by the time that the response data from the registers is sent to the host device, the response data in the SRAM has been retrieved and is ready to be sent to the host device. Similarly, although the access times to the DRAM are slower than the access times to the SRAM, by the time that the response data from the SRAM has been sent to the host device, the response data has been retrieved from the DRAM and is ready to be sent to the host device. Thus, the parallel retrieval of this data from multiple memory locations advantageously allows for a fast response time with memory that is of a lower cost to manufacture.

ADDITIONAL CONSIDERATIONS

The present invention has been described in particular detail with respect to a limited number of embodiments. Those of skill in the art will appreciate that the invention may additionally be practiced in other embodiments. The particular division of functionality between the various system components described herein is merely exemplary and not mandatory; functions performed by a single system component may instead be performed by multiple components, and functions performed by multiple components may instead be performed by a single component. Furthermore, it should be noted that the language used in the specification has been principally selected for readability and instructional purposes, and may not have been selected to delineate or circumscribe the inventive subject matter. Accordingly, the disclosure of the present invention is intended to be illustrative, but not limiting, of the scope of the invention.

The invention claimed is:

1. A method for emulating a serial interface peripheral device on a digital logic device, the digital logic device having a register set having a first plurality of register locations, a static random access memory (SRAM) having a first plurality of memory locations with a size greater than the size of the first plurality of register locations, and a dynamic random-access memory (DRAM) having a second plurality of memory locations with a size greater than the size of the memory locations of the SRAM, and a transceiver for converting data from emulated logical behavior into signals adhering to a serial interface protocol, the transceiver of the digital logic device connected to a host device through a serial interface, the method comprising:
  storing in the first plurality of register locations an initial portion of a first response data to a first plurality of commands, wherein each of the first plurality of commands is associated with one of the first plurality of register locations;
  storing in the first plurality of memory locations of the SRAM the first response data to a first plurality of commands, wherein each of the first plurality of commands is associated with one of the first plurality of memory locations of the SRAM;
  storing in a lookup table, for each of the first plurality of commands, the first memory location in the SRAM storing the first response data to the command, and the size of the first response data;
  storing in the second plurality of memory locations of the DRAM, additional response data to at least one of the first plurality of commands;
  storing in the lookup table for at least one of the first plurality of commands, one of the second plurality of memory locations of the DRAM storing the additional response data, and a size of the additional response data;
  receiving a command from a host device through the transceiver;
  retrieving the first response data from one of the first plurality of register locations and one of the first plurality of memory locations of the SRAM corresponding to the command, and sending the first response data to the host device through the transceiver; and
  in response to determining that the command includes additional response data by retrieving from the lookup table one of the second plurality of memory locations of the DRAM storing additional response data to the command, while concurrently sending the first response data to the host device, retrieving the additional response data from the one of the second plurality of memory locations of the DRAM, and sending the additional response data to the host device through the transceiver.

2. The method of claim 1, further comprising:
changing the response data to one of the first plurality of commands according to an output of a function, wherein the digital logic device responds dynamically to a command based on the function, the changing comprising:
  modifying the initial portion of the first response data in the first plurality of register locations for the one of the first plurality of commands according to the output of the function;
  modifying the first response data in the first plurality of memory locations of the SRAM for the one of the first plurality of commands according to the output of the function;
  modifying the first memory location and the size of the first response data in the lookup table for the one of the first plurality of commands;
  modifying the additional response data in the second plurality of memory locations of the DRAM for the one of the first plurality of commands according to the output of the function; and
  modifying the second memory location and the size of the additional response data in the lookup table for the one of the first plurality of commands.

3. The method of claim 2, wherein the output of the function changes based on an indication of time.

4. The method of claim 2, wherein the output of the function changes based on a combination of prior responses and currently incoming data received with the one of the first plurality of commands.

5. The method of claim 2, wherein the output of the function emulates edge cases of the serial interface peripheral device.

6. The method of claim 2, wherein the function is interchangeable with another function from a library comprising of a plurality of functions.

7. The method of claim 1, wherein the command is 8 bits wide.

8. The method of claim 1, wherein a numerical representation of one of the first plurality of commands is equal to a value of one of the first plurality of memory locations in the SRAM that correspond to the one of the first plurality of commands.

9. The method of claim 1, further comprising:
adapting the signals from the transceiver to at least one of a clock, clock edge, and voltage of the serial interface.

10. The method of claim 1, wherein the serial interface protocol is at least one of Inter IC Communication ($I^2C$), Serial Peripheral Interface (SPI), and Controller Area Network (CAN).

11. A configurable digital logic device for emulating logical behavior of a serial interface peripheral device, wherein the digital logic device is connected to a host device through a serial interface, comprising:

a register set having a first plurality of register locations;

a static random access memory (SRAM) having a first plurality of memory locations with a size greater than the size of the first plurality of register locations;

a dynamic random-access memory (DRAM) having a second plurality of memory locations with a size greater than the size of the first plurality of memory locations of the SRAM;

a transceiver converting response data from emulated logical behavior into signals adhering to a serial interface protocol which is transmitted to the host device through the serial interface; and a processor configured to:

store in the first plurality of register locations an initial portion of a first response data to a first plurality of commands, wherein each of the first plurality of commands is associated with one of the first plurality of register locations;

store in the first plurality of memory locations of the SRAM the first response data to a first plurality of commands, wherein each of the first plurality of commands is associated with one of the first plurality of memory locations of the SRAM;

store in a lookup table, for each of the first plurality of commands, the first memory location in the SRAM storing the first response data to the command, and the size of the first response data;

store in the second plurality of memory locations of the DRAM, additional response data to at least one of the first plurality of commands;

store in the lookup table for at least one of the first plurality of commands, one of the second plurality of memory locations of the DRAM storing the additional response data, and a size of the additional response data;

receive a command from a host device through the transceiver;

retrieve the first response data from one of the first plurality of register locations and one of the first plurality of memory locations of the SRAM corresponding to the command, and send the first response data to the host device through the transceiver; and in response to a determination that the command includes additional response data made by retrieving from the lookup table one of the second plurality of memory locations of the DRAM storing additional response data to the command, while concurrently sending the first response data to the host device, retrieve the additional response data from the one of the second plurality of memory locations of the DRAM, and send the additional response data to the host device through the transceiver.

12. The digital logic device of claim 11, wherein the processor is further configured to:

change the response data to one of the first plurality of commands according to an output of a function, wherein the digital logic device responds dynamically to a command based on the function, the changing comprising:

modify the initial portion of the first response data in the first plurality of register locations for the one of the first plurality of commands according to the output of the function;

modify the first response data in the first plurality of memory locations of the SRAM for the one of the first plurality of commands according to the output of the function;

modify the first memory location and the size of the first response data in the lookup table for the one of the first plurality of commands;

modify the additional response data in the second plurality of memory locations of the DRAM for the one of the first plurality of commands according to the output of the function; and modify the second memory location and the size of the additional response data in the lookup table for the one of the first plurality of commands.

13. The digital logic device of claim 12, wherein the output of the function changes based on an indication of time.

14. The digital logic device of claim 12, wherein the output of the function changes based on a combination of prior responses and currently incoming data received with the one of the first plurality of commands.

15. The digital logic device of claim 12, wherein the output of the function emulates edge cases of the serial interface peripheral device.

16. The digital logic device of claim 12, wherein the function is interchangeable with another function from a library comprising of a plurality of functions.

17. The digital logic device of claim 11, wherein the command is 8 bits wide.

18. The digital logic device of claim 11, wherein a numerical representation of the one of the first plurality of commands is equal to a value of one of the first plurality of memory locations in the SRAM that correspond to the one of the first plurality of commands.

19. The digital logic device of claim 11, wherein the transmitted signals are adapted to at least one of a clock, clock edge, and voltage of the serial interface.

20. The digital logic device of claim 11, wherein the serial interface protocol is at least one of Inter IC Communication (I$^2$C), Serial Peripheral Interface (SPI), and Controller Area Network (CAN).

* * * * *